United States Patent [19]

Fouche et al.

[11] Patent Number: 4,960,973
[45] Date of Patent: Oct. 2, 1990

[54] METHOD FOR WELDING TWO METALLIC PARTS BY LASER BEAM AND ELECTRONIC PACKAGE WELDED THEREBY

[75] Inventors: Alain Fouche, Paris; Serge Malbe, Gif Sur Yvette, both of France

[73] Assignee: Thomson Composants Microondes, Puteaux, France

[21] Appl. No.: 412,932

[22] Filed: Sep. 26, 1989

[30] Foreign Application Priority Data

Sep. 30, 1988 [FR] France .................................. 88 12800

[51] Int. Cl.$^5$ ............................................. B23K 26/00
[52] U.S. Cl. ................................................ 219/121.64
[58] Field of Search .................. 219/121.63, 121.64, 219/121.76, 121.77, 121.6, 121.85

[56] References Cited

U.S. PATENT DOCUMENTS 4,521,668 6/1985 Osial et al. ...................... 219/121.64

FOREIGN PATENT DOCUMENTS 0278643 8/1988 European Pat. Off. .
0017388 1/1986 Japan .............................. 219/121.64

OTHER PUBLICATIONS

Patent Abstracts of Japan, vol. 9, No. 279, (M-427) (2002), Nov. 7, 1985, I. Yamashita, "Laser Welding Method".

*Primary Examiner*—C. L. Albritton
*Attorney, Agent, or Firm*—Oblon, Spivak, McClelland, Maier & Neustadt

[57] ABSTRACT

A method for the welding by laser, of two metallic parts having a clearance between them. This method is characterized by a dual laser discharge operation. A first laser discharge, done with a first offset with respect to the lateral face of one part, melts a strip of metal which comes into contact with the metal of the other part. A second laser discharge, done with a second offset, smaller than the first offset, heats the two parts and forms a weld joint.

3 Claims, 1 Drawing Sheet

METHOD FOR WELDING TWO METALLIC PARTS BY LASER BEAM AND ELECTRONIC PACKAGE WELDED THEREBY

BACKGROUND OF THE INVENTION

1. Field of the Invention

The present invention concerns a method for the welding of two metallic parts by a laser beam, when there is a clearance between the parts, needed for their assembly.

2. Description of the Prior Art

Welding by laser beam is a commonly used method that gives excellent results if the laser is powerful enough, and if the parts are abutting and clean. This method is used, for example, to weld the lid laid on a package for the encapsulation of semiconductor components. The components may be sensitive to heat. This fact rules out the use of heat to cause the melting of a solder preform. However, they have to be enclosed in imperviously sealed chambers to ensure that they are protected. In this case, laser beam welding is a convenient method if the lid, placed on the package, abuts it: a laser discharge parallel to the plane of the lid and in the joint plane provides for perfect and impervious welding.

However, in certain configurations, there may be a clearance between the two parts to be welded. This is the case, for example, if the lid of a package is embedded in the grooved sides of this package. The precision with which the parts are machined results in a small clearance between these parts. This small clearance is necessary to enable the handling of the parts before their final soldering. Experience shows that, in this case, if the laser beam is discharged in the joint plane, there are always welding defects, and leakages, especially in the corners.

The method for the laser beam welding of two parts with a clearance between them consists in performing two successive laser discharges. A first discharge, done outside the joint plane, makes one of the two parts melt locally. The collapsing of the molten material puts the two parts into contact with each other, and removes the clearance at the bead of the collapsed material. A second discharge, which itself is also done outside the joint plane but is closer to the joint plane than the first discharge, does the welding between the two parts which no longer have any clearance between them.

SUMMARY OF THE INVENTION

More precisely, the invention concerns a method for the soldering, by laser beam, of two metallic parts having a, clearance between their two lateral faces to be welded, which face each other, the method comprising a dual laser beam discharge wherein:

(a) through a first laser discharge, done with a first offset with respect to a lateral face of one part, the metal of the part is partially melted, collapses and thus eliminates the clearance, and comes into contact with the metal of the other part;

(b) a second laser discharge, done with a second offset, smaller than the first offset with respect to the same lateral face, causes the metal of both parts to melt, and forms a solder joint.

BRIEF DESCRIPTION OF THE DRAWINGS

The invention will be better understood from the more detailed explanation, that now follows, of an exemplary application, given together with the appended figures, of which.

DETAILED DESCRIPTION OF THE INVENTION

To make the explanation clearer, the invention shall be described with reference to a concrete case of a package made of aluminum or aluminum alloy, the lid of which is embedded in a groove made in the sides of the base, but it is clear that this does not restrict the scope of the invention which can be applied to the welding of two metallic parts that necessarily have a slight clearance, whatever the metal used, whether it is copper, steel or another metal.

Similarly, for convenience's sake, the relative dimensions of the drawings have been adapted to the purpose of greater clarity.

Figure 1:
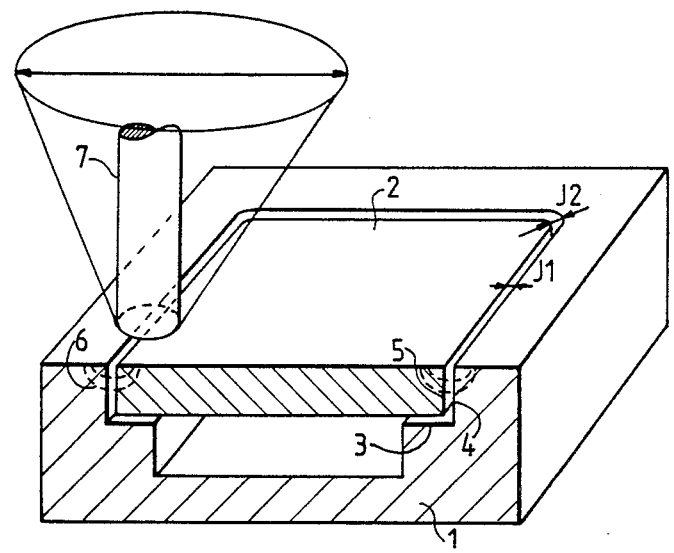
FIG. 1 shows a partially cut-away three-fourths view in space of a metallic package, the lid of which has a clearance with respect to the sides of the package.

FIG. 1 show a view of a package, cut away to show its structure. This package consists of a base 1 to which a lid 2 has to be welded. The sides of the base 1 have a groove with a horizontal surface 3 and a surface 4 that is vertical with respect to the general plane of the package which is itself assumed to be horizontal.

The lid 2 is demarcated on its rim by a vertical surface 5 which faces the vertical surface 4 of the package. It is these two surfaces 4 and 5 that have to be welded by laser beam, but there is a clearance J1 between them. There are two reasons for the existence of this clearance J1:

it must be possible to place the lid in its package without resorting to insertion by force and it must be possible to withdraw it if necessary, before final closing by welding, machining precision. For example, the dimensions of the package are X (+0.1+0.05 mm) and the dimensions of the lid are Y (0, −0.05 mm). The clearance is, therefore, at best 0.05 mm and, at worst, 0.15 mm.

But, in addition, if the package is not round, the clearance J2 in the corners is always greater. For example, the package has a machined rounding in the corners, on a radius of 2 mm (0, −0.05 mm) and the lid has a rounding on a radius of 1.8 mm (±0.1 mm)

The laser weld which it is desired to be made is shown at 6, and a laser beam such as 7 acts on a diameter of the order of 0.8–1 mm, at a range which is sufficient to heat both the package and the lid, despite the clearance between them.

If fact, if the laser discharge is done in a standard way, in positioning the axis of the laser beam 7 on the joint plane 4–5, two things are observed:

there always are welding imperfections, and leaks, in the corners, and these imperfections cannot be repaired by another laser discharge;

the parts of the package and the lid that are melted by the laser beam touch each other but do not wet each other. There is sometimes contact, but there is no welding.

These two phenomena have the same origin: the presence of a clearance of 0.05 to 0.35 mm between the parts. In this gap, there is ambient air coming from the inside of the package, despite the scavenging with neutral gas. The energy of the laser beam ionizes the air, and the two facing vertical walls 4 and 5 are oxidized at the surface As a result, the laser beam forms two half beads of molten matter, separated by a double layer of oxide of the metal constituting the package and the lid.

The method according to the invention consists, firstly, in bringing the metal of one part into contact with the metal of the other part so as to eliminate the clearance (however small it is, and necessary for the assembly of the complete package), and to obtain the reciprocal wettability of the two parts by removing the air between the parts at the welding and at the layers of oxides. Then, the welding is done and it has no defects.

Figure 2:
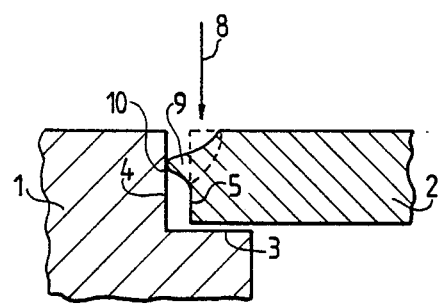
FIG. 2 shows a partial view of a weld region, after the first discharge of the laser beam of the method according to the invention.

FIG. 2 represents the first step of the method. Reference 1 designates the package element in which a lid 2 is embedded, with a slight clearance between the lateral faces 4 and 5 that are before each other. The lid lies on the face 3 of the groove in the package, and it has weld spots at some places to prevent it from being deformed during the welding operation.

A first laser discharge operation, symbolized by the arrow 8, is done with a first offset of 3/10 mm. from the edge of the face 4 of the package element 1, but the discharge could have also been aimed at the lid 2. The result thereof, for the first part, is a collapsing of material 9 which comes into contact, at 10, with the second part. Along the contact strip 10, there is no longer any air between the two parts, hence there will be no oxide formed.

More precisely, if the laser beam has a radius of 0.4 mm, if the offset is 0.3 mm and the clearance is 0.05 mm to 0.15 mm, then the second part, namely the package 1, is also slightly melted on its face 4, but this does not modify the explanation of the method. The first discharge essentially concerns one of the two parts to be welded.

Figure 3:
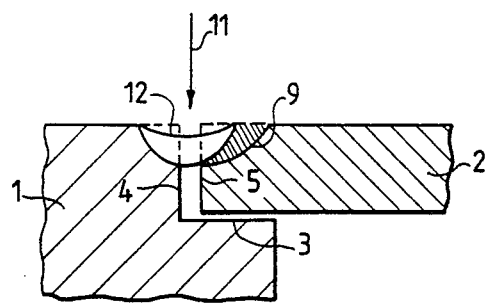
FIG. 3 shows a view of the same region as in FIG. 2, after the second discharge of the laser beam.

In a second stage, represented in FIG. 3, a second discharge of the laser beam 11, done with a second offset from the edge of the first part, forms a weld joint 12.

The second offset is smaller than the first offset. It is of the order of 0.1 mm. in the example cited so that, during the second discharge, the laser beam heats and causes the melting of the metal of the two parts to be welded. These two parts wet each other until there is no longer any formation of films of oxides.

The second cone 12 of molten material is offset with respect to the first cone 9 since the two laser discharges, are offset. Micrographic sections on parts welded by the method according to the invention clearly show the two cones of successive meltings.

The method is used more particularly for the impervious closing of packages used in microwave electronics.

What is claimed is:

1. A method for the laser beam welding of first and second metallic parts each having a lateral face facing each other, said first and second metallic parts having a clearance between their said lateral faces, comprising the steps of:

discharging a laser a first time, said laser positioned with a first offset with respect to one of said lateral faces, wherein the metal of one of said metallic parts is partially melted and collapses causing said first and second metallic parts to come into contact with each other thereby eliminating said clearance;

discharging said laser a second time, said laser positioned with a second offset which is smaller than said first offset with respect to the same one of said lateral faces, thereby melting the metal of both of said metallic parts and forming a weld joint.

2. A welding method according to claim 1, wherein the first laser discharge, by bringing the metal of the first metallic part into contact with the metal of the second metallic part, removes the air between said first and second metallic parts and provides for their wettability during the second laser discharge.

3. A welding method according to claim 1, wherein said first metallic part is a lid and said second metallic part is a base of a package, and wherein said weld joint has two offset welding strips that are traces resulting from the first and second laser discharges.

* * * * *